US012622326B2

(12) United States Patent
Liu

(10) Patent No.: US 12,622,326 B2
(45) Date of Patent: May 5, 2026

(54) POWER SEMICONDUCTOR MODULE WITH REVERSED DIODE

(71) Applicant: ZF Friedrichshafen AG, Friedrichshafen (DE)

(72) Inventor: Wei Liu, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 761 days.

(21) Appl. No.: 18/158,549

(22) Filed: Jan. 24, 2023

(65) Prior Publication Data

US 2023/0238375 A1 Jul. 27, 2023

(30) Foreign Application Priority Data

Jan. 24, 2022 (DE) .......................... 102022200708.5

(51) Int. Cl.
 *H01L 25/18* (2023.01)
 *H01L 23/373* (2006.01)
 *H01L 23/538* (2006.01)

(52) U.S. Cl.
 CPC .......... *H01L 25/18* (2013.01); *H01L 23/3735* (2013.01); *H01L 23/5383* (2013.01); *H01L 23/5385* (2013.01); *H01L 23/5386* (2013.01)

(58) Field of Classification Search
 CPC . H01L 25/18; H01L 23/3735; H01L 23/5383; H01L 23/5385; H01L 23/5386
 See application file for complete search history.

(56) References Cited

U.S. PATENT DOCUMENTS

| | | | | |
|---|---|---|---|---|
| 6,442,033 | B1 * | 8/2002 | Liu ........................ | H01L 21/563 |
| | | | | 361/743 |
| 7,030,317 | B1 * | 4/2006 | Oman ................... | H01L 23/552 |
| | | | | 257/E23.101 |
| 2014/0346676 | A1 * | 11/2014 | Horio .................. | H01L 25/0655 |
| | | | | 257/773 |
| 2021/0151417 | A1 * | 5/2021 | Strogies ............ | H01L 23/49838 |

FOREIGN PATENT DOCUMENTS

DE 11 2018 003 873 T5 4/2020

OTHER PUBLICATIONS

Office Action dated Aug. 31, 2022 for German Patent Application No. 10 2022 200 708.5 (12 pp.), note: pp. 1 and 2 are English language Explanations to Section C. Result of Determination Document.

* cited by examiner

*Primary Examiner* — Peniel M Gumedzoe
(74) *Attorney, Agent, or Firm* — Crowell & Moring LLP

(57) ABSTRACT

A power semiconductor module may include one or more of the following: a main substrate having at least one metallization layer; a semiconductor switch chip with a positive terminal on a positive terminal side and a negative terminal on a negative terminal side opposite to the positive terminal side adapted for switching a current from the positive terminal to the negative terminal; a diode chip with an anode on an anode side and a cathode on a cathode side opposite to the anode side adapted for blocking a current from the cathode to the anode, where the diode chip is bonded to the second area; a heat sink connected to the main substrate opposite to the semiconductor switch chip and the diode chip; and an auxiliary substrate having at least one metallization layer.

13 Claims, 2 Drawing Sheets

POWER SEMICONDUCTOR MODULE WITH REVERSED DIODE

RELATED APPLICATION

This application claims the benefit of, and priority to, German Patent Application DE 10 2022 200 708.5, filed Jan. 24, 2022, which is hereby incorporated by reference herein in its entirety.

TECHNICAL FIELD

The invention relates to a power semiconductor module and a half-bridge module.

BACKGROUND

In automotive applications with electrical drives, such as electrical cars and trucks, half-bridge modules are used for assembling inverters, which generate the AC current, which is needed for driving an electrical motor, from a DC current, which may be provided by an electrical battery. In the moment, such half-bridge modules comprise Si semiconductors. However, due to their higher operation voltages and the possible higher switching frequencies, which may result in lower losses and a more efficient application of the half-bridge modules, it is also considered to use high bandgap semiconductors. Such power semiconductor modules based on high bandgap semiconductors may benefit from new module designs to reduce electromagnetic radiation and losses and to improve local cooling capabilities.

Therefore, it is an object of the present invention to provide a power semiconductor module, which reduces the above-mentioned problems. This object is achieved by the subject-matter of the independent claims. Advantageous embodiments are given in the dependent claims.

BRIEF DESCRIPTION

A first aspect of the invention relates to a power semiconductor module. A power semiconductor module is a device for mechanically and electrically interconnecting semiconductor chips. Here and in the following, the term "power" refers to devices and elements adapted for processing voltages of more than 100 V and/or more than 10 A.

According to an embodiment of the invention, the power semiconductor module comprises a main substrate comprising at least one metallization layer, which is divided into a first area and a second area; a semiconductor switch chip with a positive terminal on a positive terminal side and a negative terminal on a negative terminal side opposite to the positive terminal side adapted for switching a current from the positive terminal to the negative terminal, wherein the semiconductor switch chip is bonded with the positive terminal side to the first area; a diode chip with an anode on an anode side and a cathode on a cathode side opposite to the anode side adapted for blocking a current from the cathode to the anode, wherein the diode chip is bonded with the anode side to the second area; a heat sink connected to the main substrate opposite to the semiconductor switch chip and the diode chip; and an auxiliary substrate comprising at least one metallization layer, which is divided into a third area and a fourth area; wherein the semiconductor switch chip is bonded with the negative terminal side to the third area; wherein the diode chip is bonded with the cathode side to the fourth area; and wherein the first area is electrically connected to the fourth area and the second area is electrically connected to the third area.

In summary, the power semiconductor module comprises a semiconductor switch chip and a diode chip, which are arranged in the same conduction direction side by side and which are electrically interconnected anti-parallel by two substrates (the main substrate and the auxiliary substrate). The semiconductor switch chip and the diode chip are sandwiched between the two substrates, which have structured metallization layers and which are electrically interconnected to generate the anti-parallel connection. In particular, there are separated metal patterns and/or areas between the semiconductor switch chip and the diode chip. The diode is mounted with its anode side to the main substrate, which has a heat sink on its opposite side, such that the anode side of the diode chip is better cooled than the cathode side. Usually, the heat generating layer in a diode is located more on the anode side than on the cathode side.

The power semiconductor module comprises a main substrate comprising at least one metallization layer, which is divided into a first area and a second area. The metallization layer is on an electrically isolating layer of the substrate. It is possible that a further metallization layer is provided on the isolation layer opposite to the (first) metallization layer.

The main substrate may be a DBC (direct bonded copper) substrate, i.e. one or two copper layers on a ceramics layer. The main substrate may be an (IMS) insulated metal substrate with an electrically isolating layer made of a polymer filled with ceramics particles. The one or more metallization layers may be made of metal, such as copper or aluminum. The electrically isolating layer may be made of plastics and/or ceramics.

The power semiconductor module comprises a semiconductor switch chip with a positive terminal on a positive terminal side and a negative terminal on a negative terminal side opposite to the positive terminal side. The semiconductor switch chip is adapted for switching a current from the positive terminal to the negative terminal. To this end, the semiconductor switch chip may comprise a control terminal for controlling the resistance of the path between the positive and negative terminal.

Such semiconductor switch chips (as well as the diode chip described below) may have a plastics housing, which encloses a die made of a semiconductor material, which provides the functionality of the chip. The semiconductor switch chips may provide and/or may be transistors or thyristors. The positive terminal, negative terminal and control terminal may be provided as electrodes on the housing of the chip.

It may be that the semiconductor switch chip provides a bipolar transistor, in particular an N-channel bipolar transistor, for example an IGBT. In this case, the positive terminal is the collector, the negative terminal is the emitter and the control terminal is the base.

It also may be that the semiconductor switch chip provides a field effect transistor, for example a MOSFET. In this case, the positive terminal is the drain, the negative terminal is the source and the control terminal is the gate.

As a further example, the semiconductor switch chip provides a thyristor. In this case, the positive terminal is the anode, the negative terminal is the cathode and the control terminal is the gate.

The semiconductor switch chip may be based on a wide bandgap semiconductor and/or the corresponding die may be made of a wide bandgap material. For example, the semiconductor switch chip is based on GaN (gallium nitride)

or SiC (silicon carbide). Such a semiconductor switch chip allows for higher switching frequencies and/or higher operation voltages. However, it is also possible that the semiconductor switch chip is based on silicon alone.

The power semiconductor module comprises a diode chip with an anode on an anode side and a cathode on a cathode side opposite to the anode side adapted for blocking a current from the cathode to the anode. In the case of a diode, the anode may be identified with a positive side and the cathode may be identified with a negative side.

The diode chip may be based on a wide bandgap semiconductor and/or the corresponding die may be made of a wide bandgap material, such as mentioned above. In particular, the diode chip comprises a gallium oxide diode. A gallium oxide (for example a β-Ga2O3) diode has low losses and is adapted for processing high frequencies better than a silicon diode. The diode may be a Schottky barrier diode.

The power semiconductor module comprises a heat sink connected to the main substrate opposite to the semiconductor switch chip and the diode chip. The heat sink may be bonded or otherwise attached to a metallization layer of the main substrate opposite to the metallization layer to which the semiconductor switch chip and the diode chip are bonded. For example, the heat sink may be an air cooled heat sink or a liquid cooled heat sink.

According to an embodiment of the invention, the power semiconductor module comprises an auxiliary substrate comprising at least one metallization layer, which is divided into a third area and a fourth area. The semiconductor switch chip and the diode chip may be arranged between the main substrate and the auxiliary substrate. The auxiliary substrate may be a direct bonded copper substrate or a printed circuit board. In the case of a printed circuit board, the auxiliary substrate may have one or two metallization layers, which are separated by a plastics layer.

The semiconductor switch chip is bonded with the positive terminal side to the first area of the metallization layer of the main substrate and is bonded with the negative terminal side to the third area of the metallization layer of the auxiliary substrate. The diode chip is bonded with the anode side to the second area of the metallization layer of the main substrate and is bonded with the cathode side to the fourth area of the metallization layer of the auxiliary substrate. The first area is electrically connected to the fourth area and the second area is electrically connected to the third area. In such a way, the semiconductor switch chip and the diode chip are mounted in the same conducting direction into the module but are electrically connected anti-parallel and/or in reverse conduction direction to each other. Here and in the following, bonding may refer to a process for electrically and mechanically connecting two metallic elements, such as soldering, welding and sintering.

This arrangement has the advantage that the anode side of the diode chip is better cooled than the cathode side. In particular for a gallium oxide diode and other wide bandgap materials, the thermal conduction is up to a factor of $\frac{1}{10}$ worse than with silicon and most heating inside the diode takes place near the anode layer and/or anode side. The distance of the heating layer in the diode chip to the anode side may be about 2 u to 10u, while the distance to the cathode side may be about 70u to 500 u. So cooling the anode side results in a more effective heat transfer.

According to an embodiment of the invention, the auxiliary substrate comprises an isolation layer and a second metallization layer opposite to the metallization layer to which the semiconductor switch chip and the diode chip are bonded. The third area and the second area are electrically connected to the second metallization layer. The electrically conducting back side of the auxiliary substrate may be used for electrically interconnecting the two chips.

According to an embodiment of the invention, the third area of the auxiliary substrate is connected to the second metallization layer with vias through the isolation layer. A via may be an electrically conducting element that reaches through an isolation layer between the metallization layers. In particular, in the case of a printed circuit board, such vias may be easily made.

According to an embodiment of the invention, the second area of the main substrate is connected to the second metallization layer of the auxiliary substrate with an electrically conducting post bonded to the second area of the main substrate and the second metallization layer of the auxiliary substrate. Such a post may be provided by one or more pins provided by the auxiliary substrate in the form of a printed circuit board.

According to an embodiment of the invention, the electrically conducting post is bonded to the second metallization layer at a side of the auxiliary substrate. In such a way, it is not necessary to provide a through hole in the auxiliary substrate. The fourth area of the metallization layer of the auxiliary substrate may be structured, such that a gap is formed on the isolation between the fourth area and the side of the auxiliary substrate, where the electrically conducting post is bonded.

According to an embodiment of the invention, the electrically conducting post is arranged between the semiconductor switch chip and the diode chip. A through hole through the auxiliary substrate may be provided through which the post can reach to the main substrate. The electrically conducting post protrudes through the isolation layer of the auxiliary substrate. The post may be a pin provided by the auxiliary substrate in the form of a printed circuit board. Arranging the electrically conducting post between the semiconductor switch chip and the diode chip may result in a small conductor loop and lower losses.

According to an embodiment of the invention, from a view in a direction orthogonal to the main substrate and the auxiliary substrate, the first area and the fourth area overlap each other. Each of the main substrate and the auxiliary substrate defines a plane, which are substantially parallel to each other. The view direction is substantially orthogonal to these planes. The first area and the fourth area are electrically connected with a (second) electrically conducting post bonded to the first area and the fourth area. Such a post may be pin provided by the auxiliary substrate in the form of a printed circuit board.

It has to be understood that also with respect to this view direction, the first and third area and the second and fourth area also overlap each other, such that the chips can be bonded between them.

A further aspect of the invention relates to a half-bridge module, which is composed of a first and a second power semiconductor module as described herein. Here composed means that the half-bridge module has two parts, each of which is designed like the power semiconductor module as described above and below.

The chips in the half-bridge module are interconnected to form a half-bridge, i.e. two semiconductor switch chips connected in series and a free-wheeling diode chip connected anti-parallel to each semiconductor switch chip.

The main substrate of the first power semiconductor module and the main substrate of the second power semiconductor module are provided by a main substrate of the half-bridge module. The main substrate of the half-bridge module may comprise a common isolation layer for both power semiconductor modules. The second area of the first power semiconductor module and the first area of the second power semiconductor module are provided by an AC area of the half-bridge module. The first area of the first power semiconductor module is a DC+ area of the half-bridge module. The second area of the second power semiconductor module is a DC− area of the half-bridge module.

It may be that the half-bridge module has two auxiliary substrates, one for each power semiconductor module. It also may be that the first auxiliary substrate of the first power semiconductor module and the second auxiliary substrate of the second power semiconductor module are provided by an auxiliary substrate of the half-bridge module, which has a common isolation layer for both of the power semiconductor modules.

BRIEF DESCRIPTION OF THE DRAWINGS

These and other aspects of the invention will be apparent from and elucidated with reference to the embodiments described hereinafter. Below, embodiments of the present invention are described in more detail with reference to the attached drawings.

DETAILED DESCRIPTION

Figure 1:
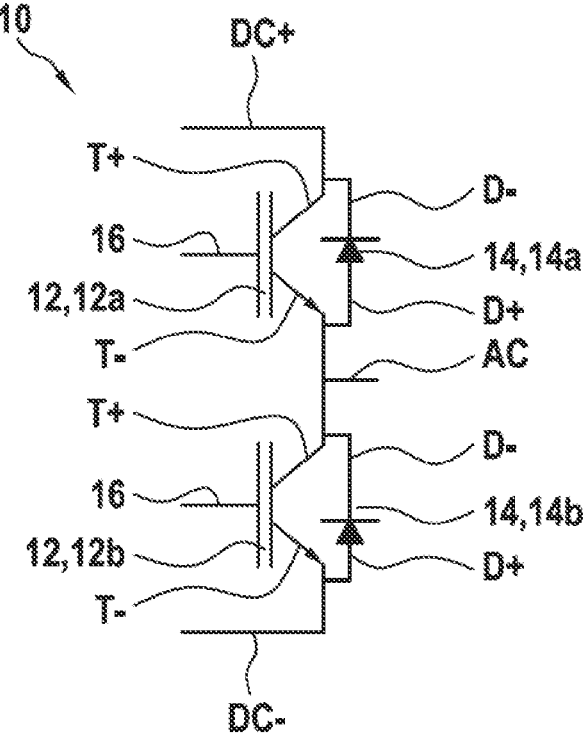
FIG. 1 shows a circuit diagram of a half-bridge module according to an embodiment of the invention.

The reference symbols used in the drawings, and their meanings, are listed in summary form in the list of reference symbols below. In principle, identical parts are provided with the same reference symbols in the figures.

FIG. 1 shows a circuit diagram of a half-bridge module 10, which comprises two semiconductor switch chips 12, 12a, 12b, which are electrically connected in series. A free-wheeling diode chip 14, 14a, 14b is connected anti-parallel to each semiconductor switch chip 12, 12a, 12b. Each semiconductor switch chip 12, 12a, 12b comprises a positive terminal T+, a negative terminal T− and a control terminal 16. Each diode chip 14, 14a, 14b comprises an anode D+ and a cathode D−.

The positive terminal T+ of the first semiconductor switch chip 12a and the cathode D− of the first diode chip 14a are connected with each other and are connected to the DC+ terminal of the half-bridge module 10. The negative terminal T− of the second semiconductor switch chip 12b and the anode D+ of the second diode chip 14b are connected with each other and are connected to the DC− terminal of the half-bridge module 10.

The negative terminal T− of the first semiconductor switch chip 12a, the anode D+ of the first diode chip 14a, the positive terminal T+ of the second semiconductor switch chip 12b and the cathode D− of the second diode chip 14b are connected with each other and are connected to the AC terminal of the half-bridge module 10.

The diode chips 14, 14a, 14b may provide a gallium oxide diode, in particular made of β-Ga2O3, and/or may be a Schottky barrier diode.

The semiconductor switch chips 12, 12a, 12b may provide a bipolar transistor, such as an IGBT, a field effect transistor, such as a MOSFET, or a thyristor. Also, the semiconductor switch chips 12, 12a, 12b may be made of a wide bandgap material.

Figure 2:
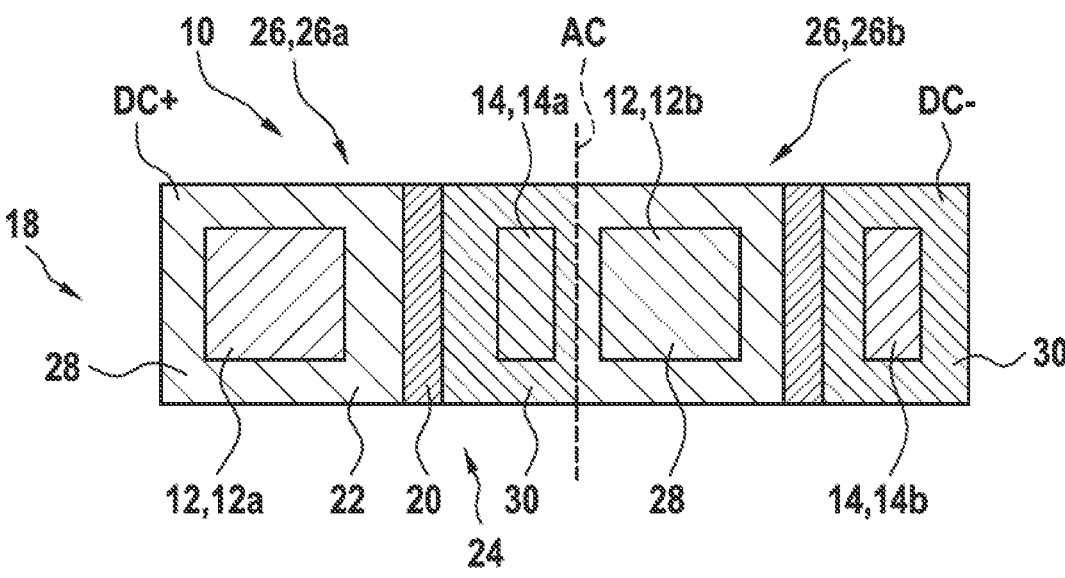
FIG. 2 shows a schematic cross-sectional view of a half-bridge module according to an embodiment of the invention.

FIG. 2 shows a schematic cross-sectional view of a half-bridge module 10, in which the semiconductor switch chips 12, 12a, 12b and the diode chips 14, 14a, 14b are bonded to a main substrate 18. The main substrate 18 is composed of an isolation layer 20, which is sandwiched between two metallization layers 22, 24. The main substrate 18 may be a printed circuit board, an IMS (insulated metal substrate) or a DBC (direct bonded copper) substrate. It also may be that the main substrate 18 comprises more than three layers.

The semiconductor switch chips 12, 12a, 12b and the diode chips 14, 14a, 14b are bonded to the metallization layer 22. The metallization layer 22 is structured and is divided into a DC+ area, connected to the DC+ terminal, an AC area, connected to the AC terminal and a DC− area, connected to the DC− terminal. The semiconductor switch chip 12a is bonded to the DC+ area, the diode chip 14a and the semiconductor switch chip 12b are bonded to the AC area and the diode chip 14b is bonded to the DC− area.

As will be explained with respect to FIG. 3 and FIG. 4, the half-bridge module 10 is composed of two parts, each of which can be seen as a power semiconductor module 26, 26a, 26b of its own. A dividing line between the two semiconductor modules 26, 26a, 26b is shown in FIG. 2. Each of the semiconductor modules 26, 26a, 26b has a first area 28 of the metallization layer 22 to which the semiconductor switch chip 12, 12a, 12b is bonded, and a second area 30, to which the diode chip 14, 14a, 14b is bonded.

Figure 3:
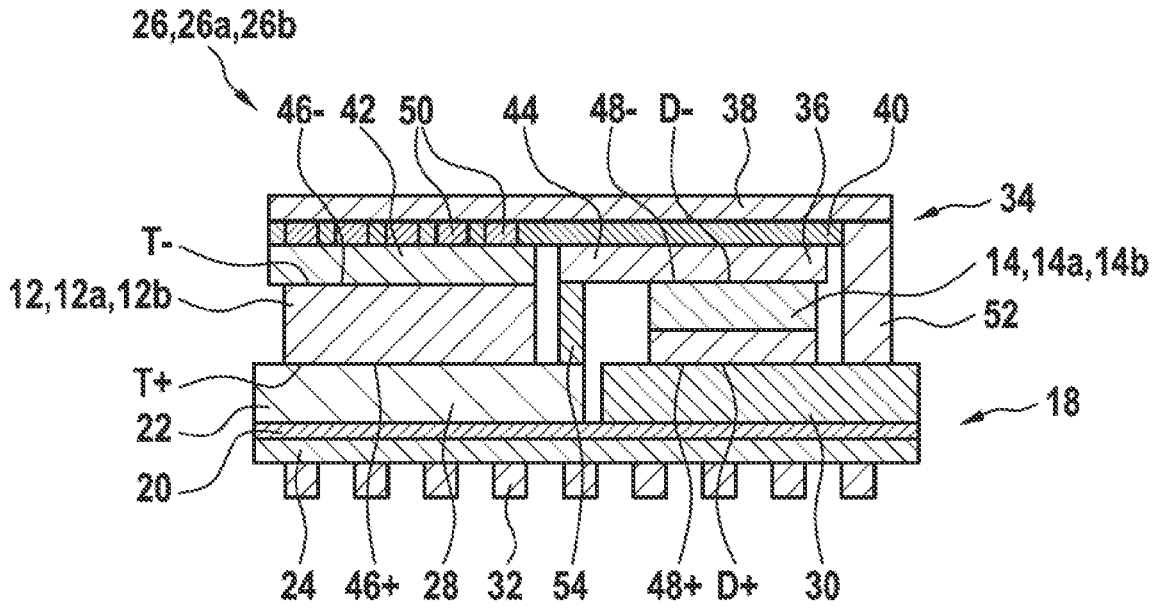
FIG. 3 shows a schematic cross-sectional view of a power semiconductor module according to an embodiment of the invention.
Figure 4:
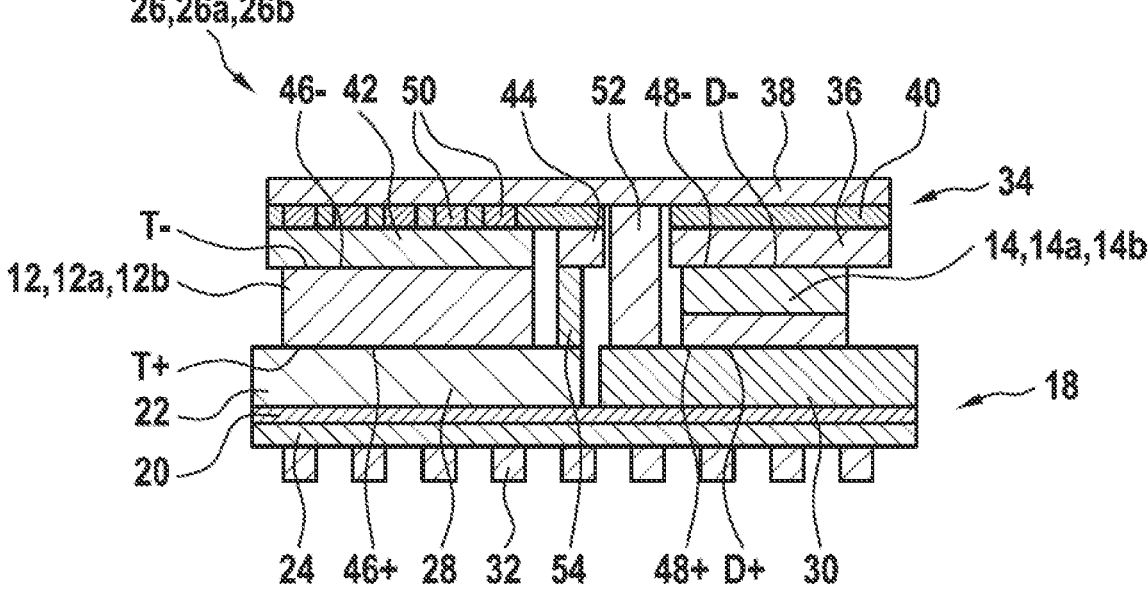
FIG. 4 shows a schematic cross-sectional view of a power semiconductor module according to a further embodiment of the invention.

FIGS. 3 and 4 show cross-sectional views of power semiconductor modules 26, 26a, 26b, which may be used in the half-bridge module 10 of FIGS. 1 and 2. While FIG. 2 is a cross-section along a plane in which the main substrate 18 extends, FIG. 3 and FIG. 4 are cross-sections along a plane orthogonal to the plane of the main substrate.

FIGS. 3 and 4 show that a heat sink 32 is attached to the metallization layer 24 of the main substrate 18. The heat sink 32 may be bonded or otherwise attached to the back side of the main substrate 18 opposite to the semiconductor switch chip 12, 12a, 12b and the diode chip 14, 14a, 14b. The heat sink 32 may be any kind of cooling element and/or may be based on air and water cooling. Also active and passive cooling may be possible.

The power semiconductor module 26, 26a, 26b furthermore comprises an auxiliary substrate 34, which is composed of two metallization layers 36, 38 and an isolation layer 40 sandwiched between the metallization layers 36, 38. The auxiliary substrate 34 may be a DBC (direct bonded copper) substrate or a PCB (printed circuit board). The semiconductor switch chip 12, 12a, 12b and the diode chip 14, 14a, 14b are arranged between the main substrate 18 and the auxiliary substrate 34.

The metallization layer 36 is structured and is divided into a third area 42 and a fourth area 44.

The semiconductor switch chip 12, 12a, 12b comprises the positive terminal T+ on a positive terminal side 46+ and the negative terminal T− on a negative terminal side 46− opposite to the positive terminal side 46+. The semiconductor switch chip 12 is bonded with the positive terminal side 46a to the first area 28 and with the negative terminal side 46– to the third area 42.

The diode chip 14 comprises the anode D+ on an anode side 48+ and the cathode D– on a cathode side 48– opposite to the anode side 48+. The diode chip 14 is bonded with the anode side 48+ to the second area 30 and with the cathode side 48– to the fourth area 44.

As shown in FIGS. 3 and 4, the first area 28 is electrically connected to the fourth area 44 and the second area 30 is electrically connected to the third area 42. In such a way, the diode chip 14 (with respect to the anode side 48+ and the cathode side 48–) is arranged in parallel and/or in the same conduction direction as the semiconductor switch chip 12 (with respect to the positive terminal side 46+ and the negative terminal side 46–). This is beneficial in view of cooling. Furthermore, via the auxiliary substrate 34, the diode chip 14 is electrically connected anti-parallel to the semiconductor switch chip 12.

In particular, when the diode chip 14 provides a gallium oxide diode and/or a diode made of other wide bandgap materials, the thermal conduction is worse than in silicon. Furthermore, most heating inside the diode chip 14 takes place near the anode layer and/or anode side 48+. The distance of the layer in the diode chip 14, where most of the heat is generated, to the anode side 48+ may be about 2 u to 10 u, while the distance to the cathode side 48– to this layer may be about 70 u to 500 u. So cooling the anode side 48+, which is directed towards the heat sink 32, results in a more effective heat transfer.

As shown in FIGS. 3 and 4, the third area 42 of the auxiliary substrate 34 and the second area 30 of the main substrate 18 are electrically connected to the second metallization layer 38. On the one side, for example above the semiconductor switch chip 12, the third area 42 is connected to the second metallization layer 38 with vias 50 through the isolation layer 40 of the auxiliary substrate 34.

The second area 30 is connected to the second metallization layer 38 with an electrically conducting post 52 bonded to the second area 30 and the second metallization layer 38. As shown in FIG. 3, the electrically conducting post 52 is bonded to the second metallization layer 38 at a side of the auxiliary substrate 34. As shown in FIG. 4, the electrically conducting post 52 is arranged between the semiconductor switch chip 12 and the diode chip 14 and the electrically conducting post 52 protrudes through the isolation layer 40 of the auxiliary substrate 34. This may result in smaller induction loops of the power semiconductor module 26.

Furthermore, from a view in a direction orthogonal to the main substrate 18 and the auxiliary substrate 34, the first area 28 and the fourth area 44 overlap each other. To electrically connect these two areas 28, 34 to the first area 28 and the fourth area 44 an electrically conducting post 54 is used, which is bonded to the first area 28 and the fourth area 44.

The auxiliary substrate 34 may be a PCB and the posts 52 and 54 may be pins that are soldered to the respective metallization layer 36, 38. When attaching the auxiliary substrate 34 to the rest of the power semiconductor module 26, the pins and/or posts 52, 54 may be soldered to the metallization layer 22.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 half-bridge module
12 semiconductor switch chip
12a first semiconductor switch chip
12b second semiconductor switch chip
14 diode chip
14a first diode chip
14b second diode chip
T+ positive terminal
T– negative terminal
16 control terminal
D+ anode
D– cathode
DC+ DC+ terminal/DC+ area
DC– DC– terminal/DC– area
AC AC terminal/AC area
18 main substrate
20 isolation layer
22 first metallization layer
24 second metallization layer
26 power semiconductor module
26a first power semiconductor module
26b second power semiconductor module
28 first area
30 second area
32 heat sink
34 auxiliary substrate
36 first metallization layer
38 second metallization layer
40 isolation layer
42 third area
44 fourth area
46+ positive terminal side
46– negative terminal side
48+ anode side
48– cathode side
50 via
52 first electrically conducting post
54 second electrically conducting post

I claim:
1. A power semiconductor module, comprising:
a main substrate comprising at least one metallization layer, which is divided into a first area and a second area;
a semiconductor switch chip with a positive terminal on a positive terminal side and a negative terminal on a negative terminal side opposite to the positive terminal side adapted for switching a current from the positive terminal to the negative terminal, wherein the semiconductor switch chip is bonded with the positive terminal side to the first area;
a diode chip with an anode on an anode side and a cathode on a cathode side opposite to the anode side adapted for blocking a current from the cathode to the anode, wherein the diode chip is bonded with the anode side to the second area;

a heat sink connected to the main substrate opposite to the semiconductor switch chip and the diode chip;

an auxiliary substrate comprising at least one metallization layer, which is divided into a third area and a fourth area;

wherein the semiconductor switch chip is bonded with the negative terminal side to the third area, wherein the diode chip is bonded with the cathode side to the fourth area, and wherein the first area is electrically connected to the fourth area and the second area is electrically connected to the third area.

2. The power semiconductor module of claim 1, wherein the auxiliary substrate comprises an isolation layer and a second metallization layer opposite to the metallization layer to which the semiconductor switch chip and the diode chip are bonded, and wherein the third area and the second area are electrically connected to the second metallization layer.

3. The power semiconductor module of claim 2, wherein the third area is connected to the second metallization layer with vias through the isolation layer.

4. The power semiconductor module of claim 2, wherein the second area is connected to the second metallization layer with an electrically conducting post bonded to the second area and the second metallization layer.

5. The power semiconductor module of claim 4, wherein the electrically conducting post is bonded to the second metallization layer at a side of the auxiliary substrate.

6. The power semiconductor module of claim 4, wherein the electrically conducting post is arranged between the semiconductor switch chip and the diode chip, and wherein the electrically conducting post protrudes through the isolation layer of the auxiliary substrate.

7. The power semiconductor module of claim 1, wherein from a view in a direction orthogonal to the main substrate and the auxiliary substrate, the first area and the fourth area overlap each other, and wherein the first area and the fourth area are electrically connected with an electrically conducting post bonded to the first area and the fourth area.

8. The power semiconductor module of one of claim 1, wherein the diode chip comprises a gallium oxide diode.

9. The power semiconductor module of claim 1, wherein the semiconductor switch chip provides a bipolar transistor, for example an IGBT.

10. The power semiconductor module of claim 1, wherein the semiconductor switch chip provides a field effect transistor.

11. The power semiconductor module of claim 1, wherein the semiconductor switch chip provides a thyristor.

12. The power semiconductor module of claim 1, wherein the main substrate is a direct bonded copper substrate or an insulated metal substrate; and/or wherein the auxiliary substrate is a direct bonded copper substrate or a printed circuit board.

13. A half-bridge module, comprising:

a first and a second power semiconductor module according to claim 1, wherein the main substrate of the first power semiconductor module and the main substrate of the second power semiconductor module are provided by a main substrate of the half-bridge module, and wherein the second area of the first power semiconductor module and the first area of the second power semiconductor module are provided by an AC area of the half-bridge module.

* * * * *